United States Patent
Butts et al.

(10) Patent No.: US 7,679,402 B2
(45) Date of Patent: Mar. 16, 2010

(54) METHODS AND APPARATUS FOR MONITORING POWER GATING CIRCUITRY AND FOR CONTROLLING CIRCUIT OPERATIONS IN DEPENDENCE ON MONITORED POWER GATING CONDITIONS

(75) Inventors: J. Adam Butts, Hartsdale, NY (US); Gary S. Ditlow, Garrison, NY (US); Stephen V. Kosonocky, Fort Collins, CO (US); Brian C. Monwai, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/062,102

(22) Filed: Apr. 3, 2008

(65) Prior Publication Data

US 2009/0251171 A1 Oct. 8, 2009

(51) Int. Cl.
*H03K 19/0175* (2006.01)
(52) U.S. Cl. .............................. 326/81; 326/83; 326/92; 326/95; 326/98
(58) Field of Classification Search .................. 326/81, 326/83, 93, 95, 98
See application file for complete search history.

(56) References Cited

U.S. PATENT DOCUMENTS

| 5,726,946 A * | 3/1998 | Yamagata et al. ............ 365/226 |
| 6,603,217 B2 * | 8/2003 | Ooishi et al. .................. 307/29 |
| 7,256,644 B2 * | 8/2007 | Ooishi et al. ................. 327/544 |
| 2007/0103195 A1 * | 5/2007 | Duk-Sohn et al. ............. 326/41 |

* cited by examiner

*Primary Examiner*—Vibol Tan
(74) *Attorney, Agent, or Firm*—Harrington & Smith

(57) ABSTRACT

A circuit incorporating a current starved ring oscillator is coupled to a power gate switch in an integrated circuit. The circuit incorporating the current starved ring oscillator amplifies a voltage difference between a virtual ground associated with the power gate switch and ground, and converts the difference to a frequency. Digital logic monitors the output of the ring oscillator using a counter and a reference clock. Control circuitry controls operation of the integrated circuit in dependence on the monitored conditions associated with the power gate switch. A method monitors a virtual ground voltage across a power gate switch in an integrated circuit; and controls operation of the integrated circuit in dependence on the monitored virtual ground voltage.

15 Claims, 6 Drawing Sheets

METHODS AND APPARATUS FOR MONITORING POWER GATING CIRCUITRY AND FOR CONTROLLING CIRCUIT OPERATIONS IN DEPENDENCE ON MONITORED POWER GATING CONDITIONS

TECHNICAL FIELD

The present invention generally concerns methods and apparatus for monitoring and controlling integrated circuits and more particularly concerns methods and apparatus for monitoring conditions associated with power gating circuitry in integrated circuits and for controlling the operation of the integrated circuits based on the monitored power gating conditions.

BACKGROUND

In the field of integrated circuits there is an ongoing desire to reduce power dissipation. An obvious reason for such a desire is that energy is not free. Often, integrated circuits are combined into devices such as servers. Servers may operate in installations containing many such devices that operate twenty-four hours a day, seven days a week. In such a situation, energy costs can quickly escalate. Accordingly, circuit designers are continually seeking new ways to reduce power dissipation.

A not-so-apparent reason for seeking to reduce power dissipation is that power use in integrated circuits generates heat. Many such integrated circuits working together can generate a great deal of heat. If not handled properly, heat can have negative consequences for the operation of integrated circuits. Excessive heat can cause integrated circuits to fail prematurely, resulting in unforeseen maintenance and repair costs. Even if anticipated, excessive heat generation can have negative consequences by requiring complex designs incorporating cooling apparatus that also dissipate power.

Corporations and institutions responsible for energy costs are continually seeking devices that cost less to operate. One known technology to reduce power dissipation is called power gating. When logic circuitry that is capable of performing functional operations is not needed, power gating circuitry switches the power off to the logic circuitry.

Power gating logic circuits have been demonstrated to reduce standby leakage by greater than an order of magnitude in CMOS circuits. One typical method of power gating is to use a shared NFET (N-type field effect transistor) device as a power supply interrupt switch (footer). Sizing the footer presents challenges for the circuit designer; too large of a footer reduces the potential leakage savings, too small of a footer will cause a rise in the voltage of the virtual ground node (footer drain) and slow down the operation of the gated logic during the functional mode. Correct sizing is imperative to optimize the competing trade-offs. Sizing the footer correctly requires detailed knowledge of active power consumption, which is often not known accurately for a particular circuit at the time when the power-gating footer must be sized. Turn-on current transients also can cause ground bounce on the virtual ground node. These transients can be avoided by allowing extra "dead" cycles between sleep modes and functional operation, at the expense of system performance. However, introduction of extra "dead" cycles can result in inefficient operation since in some situations the dead cycles may be unnecessary.

Accordingly, those skilled in the art seek methods and apparatus that are capable of controlling integrated circuits incorporating power gating technology in such a manner that reacts to the dynamic conditions being experienced by the power gating circuitry. The prior art is not seen to appreciate the need for monitoring operating conditions associated with the power gating circuitry. A need therefore exists for apparatus and methods that can monitor the internal level of a virtual ground node associated with power gating circuitry. The apparatus preferably should be a low circuit area device with high sensitivity to small changes in the virtual ground level.

SUMMARY OF THE INVENTION

A first embodiment of the invention is a circuit comprising: logic circuitry; a power gate switch coupled to at least a portion of the logic circuitry; and a virtual ground monitoring circuit configured to monitor voltage across the power gate switch.

A second embodiment of the invention is an integrated circuit comprising: logic circuitry; a ground rail; a power gate switch coupled between the logic circuitry and the ground rail, a node between the logic circuitry and the power gate switch corresponding to a virtual ground rail, the power gate switch configured to switch power to the logic circuitry on and off; and a virtual ground monitoring circuit configured to monitor voltage across the power gate switch, the virtual ground monitoring circuit comprising: signal output configured to output a virtual ground monitor signal that changes in dependence on changes to the voltage across the power gate switch.

A third embodiment of the invention is a method comprising: monitoring a virtual ground voltage across a power gate switch in an integrated circuit comprising at least the power gate switch and logic circuitry; and controlling operation of the integrated circuit in dependence on the monitored virtual ground voltage.

The foregoing summary of the various embodiments of the present invention is exemplary and non-limiting. For example, one with ordinary skill in the art will understand that one or more aspects or steps from one embodiment can be combined with one or more aspects or steps from another embodiment to create a new embodiment within the scope of the present invention.

BRIEF DESCRIPTION OF THE DRAWINGS

The foregoing and other aspects of these teachings are made more evident in the following Detailed Description of the Invention, when read in conjunction with the attached Drawing Figures, wherein.

DETAILED DESCRIPTION OF THE INVENTION

Figure 1:
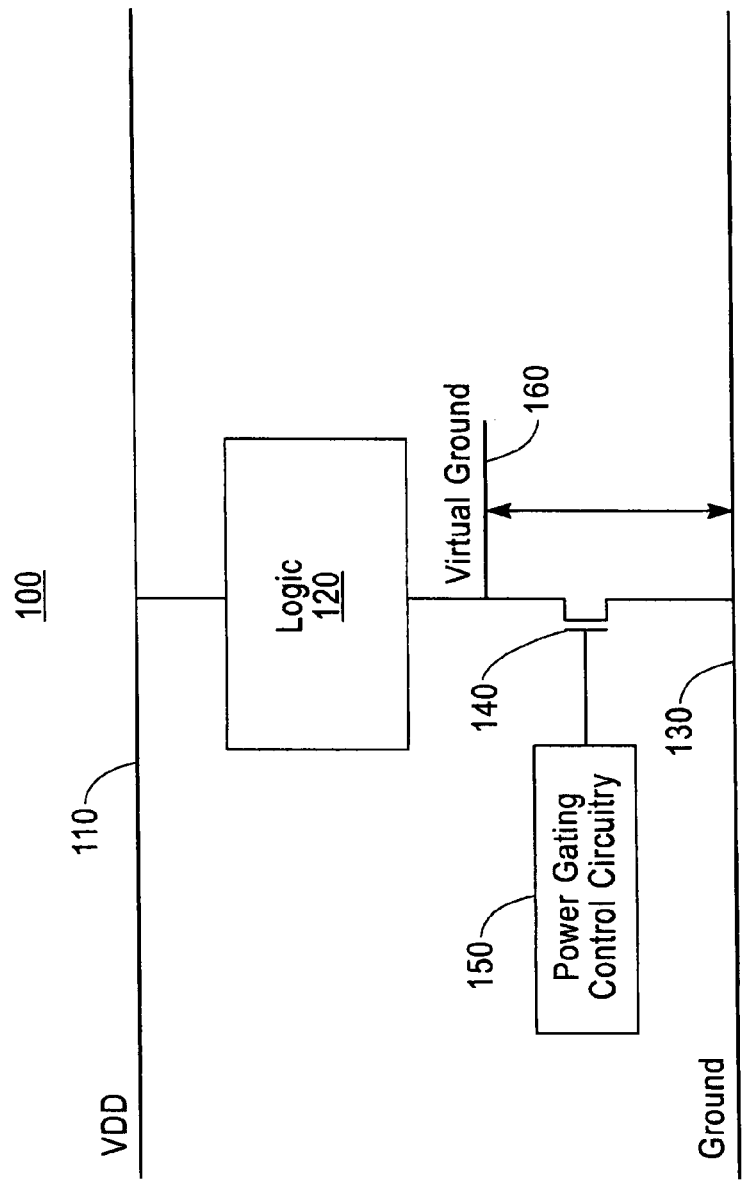
FIG. 1 is a block diagram depicting a conventional power gating arrangement.

FIG. 1 depicts a conventional power gating arrangement for controlling associated logic circuitry. The circuit 100 includes a power rail 110 supplying power to logic circuits 120 and a ground rail 130. The logic circuitry 120 is coupled to power gating switch 140, which in turn is coupled to the power gating control circuitry 150. As indicated, virtual ground 160 is located at the junction between the logic circuitry and the power gating switch. Those skilled in the art have become aware of the limitations of the conventional arrangement depicted in FIG. 1. Since so-called "ground bounce" and other transient phenomena are typically encountered during switching operations from sleep modes to functional operations, those skilled in the art have introduced dead cycles to avoid adverse effects of the transient phenomena on circuit operation. This can have a negative consequence on the efficiency of operation of devices incorporating power gating circuitry, since the "dead cycles" represent periods when no useful operations can be performed by the logic circuitry.

Figure 2:
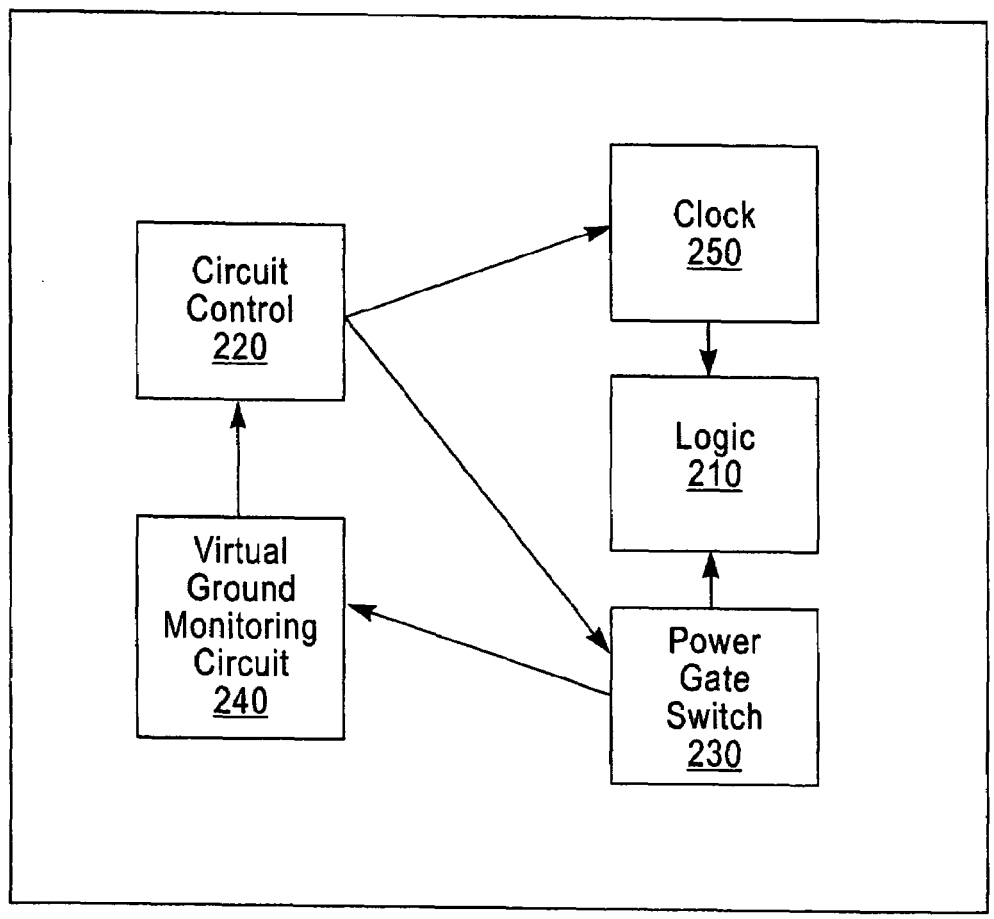
FIG. 2 is a block diagram depicting an integrated circuit configured in accordance with the invention.

FIG. 2 is a block diagram depicting an integrated circuit 200 configured in accordance with the invention. The integrated circuit 200 comprises logic 210 for performing functional operations; a control circuit 220; a power gate switch 230; a virtual ground monitoring circuit 240 for monitoring a virtual ground associated with the power gate switch; and a clock 250. In contrast to a conventional arrangement like that depicted in FIG. 1, the apparatus depicted in FIG. 2 is configured to monitor a virtual ground associated with the power gating switch 230. For example, by having knowledge of the virtual ground conditions associated with the power gate switch, the control circuit 220 can control the integrated circuit 200 with reference to "ground bounce" and other transient phenomena associated with operation of the power gate switch 230. In one embodiment of the invention, the control circuit 220 can slow the clock frequency in dependence on a virtual ground monitor signal received from the virtual ground monitoring circuit. Alternatively, the control circuit can introduce additional "dead cycles" during switching operations. In contrast to the prior art, though, these operations are performed with reference to the actual conditions being experienced by the power gate switch.

Figure 3:
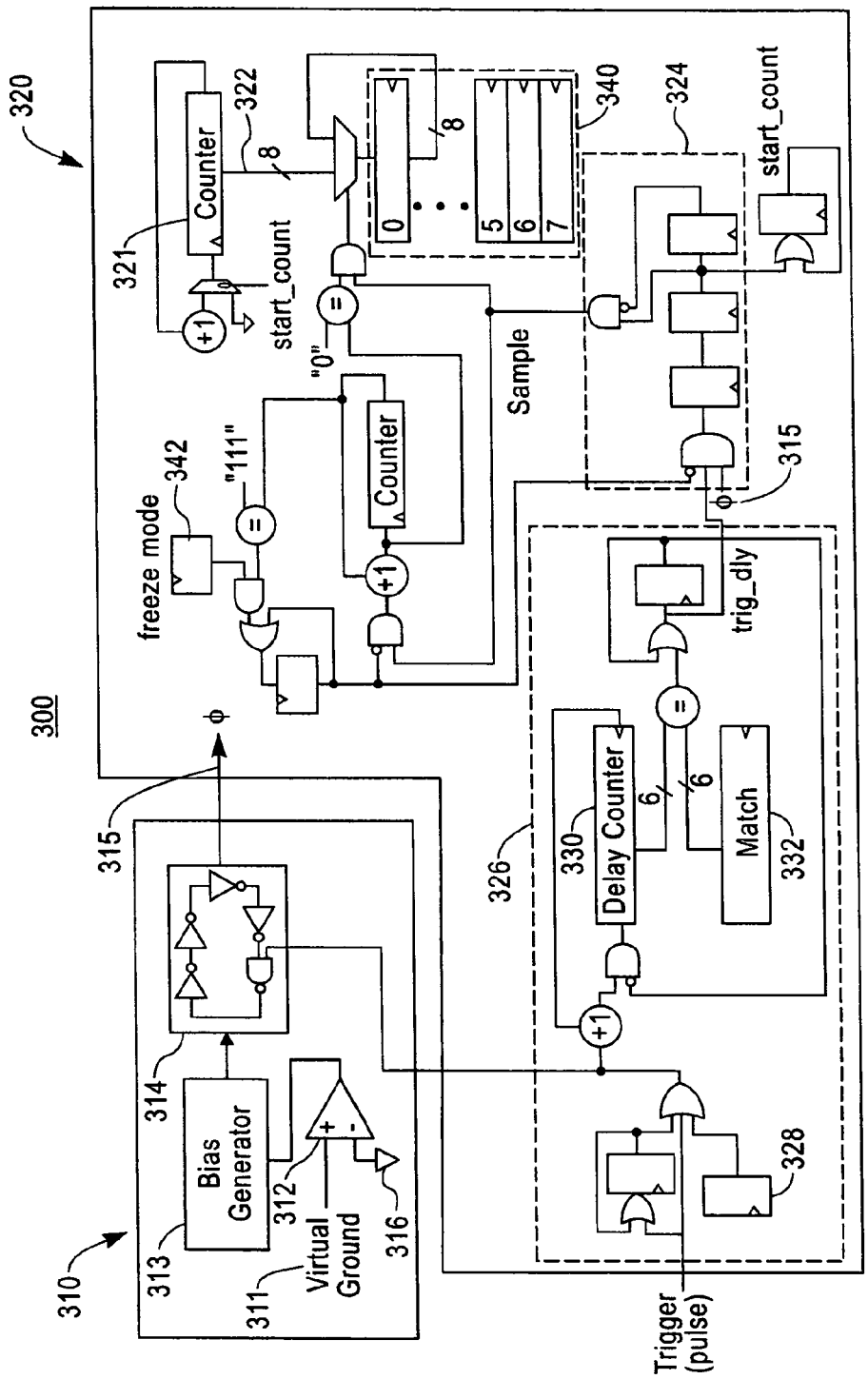
FIG. 3 is a block diagram depicting power gating monitoring circuitry configured in accordance with the invention.

FIG. 3 is a logic diagram of power gating monitoring and control circuitry 300 configured to operate in accordance with the invention. The circuit operates by amplifying the difference between virtual ground associated with the power gating circuitry and ground and converts the difference to a frequency using a current-starved ring oscillator. Digital logic is then used to monitor the output of the ring oscillator by a counter and a reference clock. Box 310 encloses a differential amplifier 312 coupled to virtual ground 311; a bias generator 313 coupled to the amplifier 312, and a current-starved ring oscillator 314. Output pulses 315 from the current-starved ring oscillator 314 is sample counter 321. The reference clock that drives the logic in box 320 runs at least twice as fast as the ring oscillator output 312. Because the reference clock and ring oscillator are asynchronous, a synchronizer 324 generates one single-cycle pulse synchronized to the reference clock for each pulse of the ring-oscillator output.

Sample values 322 are sent to control circuit 220 (see FIG. 2) to enable interpretation of and reaction to the conditions of the virtual ground. Larger differences between the virtual ground 311 and the true ground reference 316 will result in a higher sample frequency of the counter 321, which in turn results in smaller differences between consecutive sample values sent to the control circuit 220.

Additional features are apparent in the digital logic 320. A trigger circuit 326 controls when the monitoring of the virtual ground will begin. Alternatively, a forced trigger mode may be enabled via latch 328 to cause continuous sampling. A delay counter 330 allows the monitoring to begin a specified time (stored in latch 332) after the actual trigger. Counter sample values 322 are stored in a ring buffer 340 for diagnostic ability. A control flag 342 determines whether consecutive samples continue to overwrite the buffer entries in a round-robin manner, or only overwrite the final entry, maintaining the beginning of the sample. The embodiment depicted in FIG. 3 is exemplary and the invention may be practiced in embodiments differing from that depicted in FIG. 3.

Figure 4:
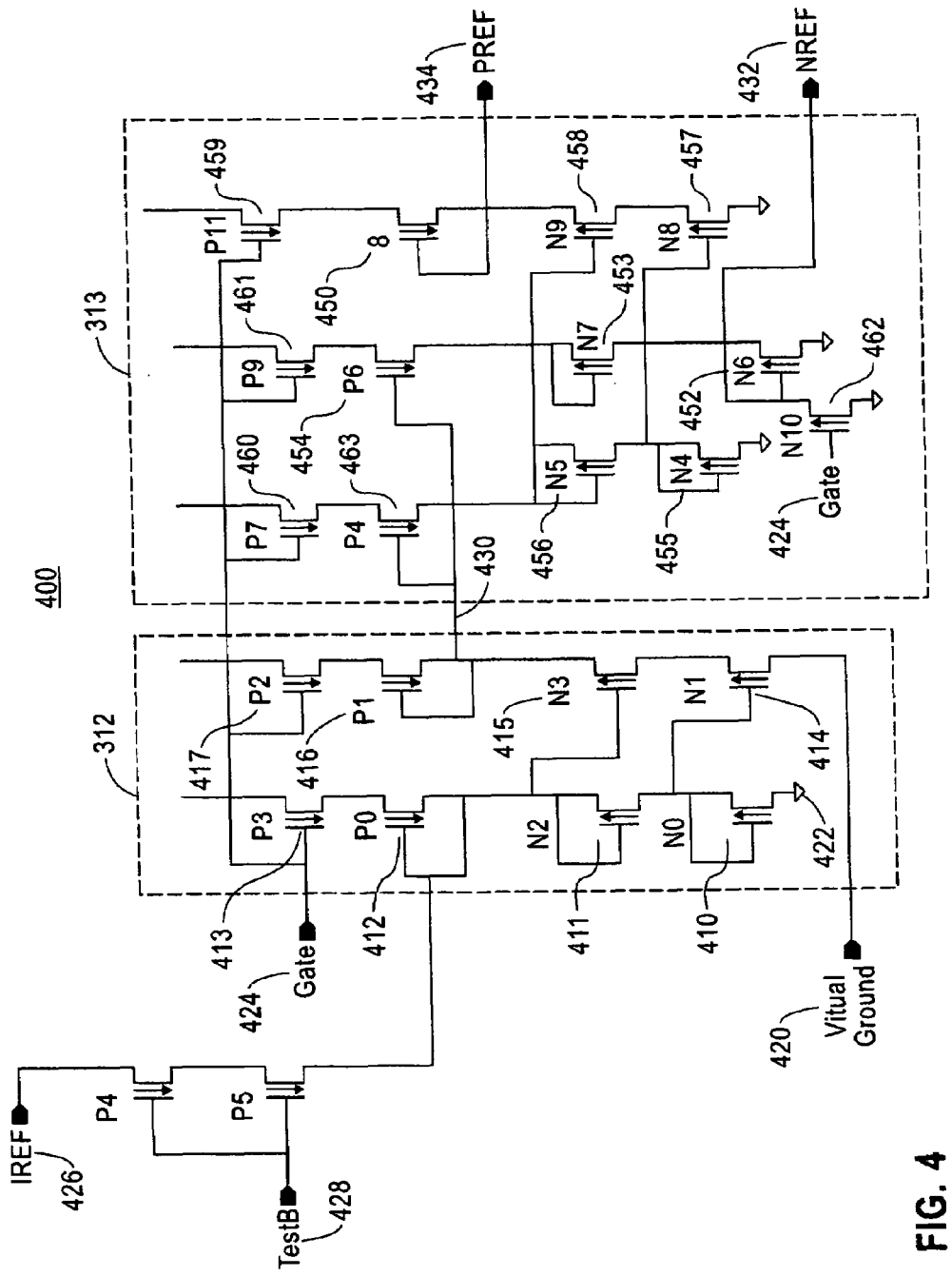
FIG. 4 is a circuit diagram depicting in greater detail the amplifier and bias generator depicted in FIG. 3, all configured in accordance with the invention.

FIG. 4 is a circuit diagram depicting in greater detail an amplifier 312 and bias generator 313 depicted in FIG. 3. FETs N0 (410), N2 (411), and P0 (412) are diode-connected devices that set up bias voltages for N1 (414) and N3 (415). When the virtual ground voltage 420 equals the reference ground voltage 422, the current through N1 (414) and N3 (415) mirrors the current through N0 and N2. As the virtual ground voltage rises, N1 enters the subthreshold region of operation, quickly reducing the current through N1 and N3. P1 (416) acts as an active-load, converting the current to a reference voltage 430 for the bias generator 313. P2 (417) and P3 (413) allow the bias circuit to be shut off under the control of a gate signal 424. P4 and P5 allow an external reference current IREF (426) to be injected into the current mirror for calibration under the control of test signal TESTB (428).

Bias generator 313 converts voltage 430 into reference voltages NREF (432) and PREF (434) to drive the ring-oscillator. Voltage 430 generates a current in P6 (454), which is converted to NREF in active load devices N6 (452) and N7 (453). Similarly, voltage 430 generates a current in P4 (463), which, loaded by devices N4 (455) and N5 (456), generates bias voltages for devices N8 (457) and N9 (458). The current through N8 (457) and N9 (458) are converted to PREF by active load P11 (459). The additional stage in the generation of PREF is required such that PREF and NREF track the virtual ground voltage in the opposite sense. As the virtual ground voltage rises, NREF also rises, while PREF decreases. Devices P7 (460), P9 (461), P11 (459), and N1 (462), cause the ring oscillator to stop when the gate signal is high by forcing NREF low and PREF high.

Figure 5:
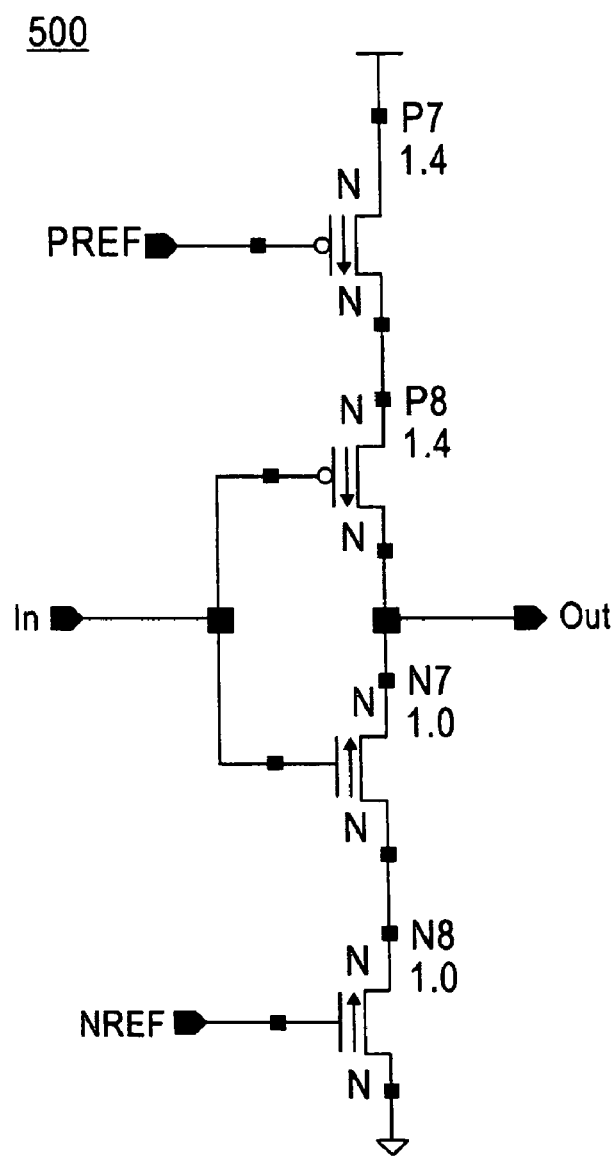
FIG. 5 is a circuit diagram depicting a portion of a current-starved ring oscillator configured in accordance with the invention.

FIG. 5 is a circuit diagram depicting a portion of a current-starved ring oscillator configured in accordance with the invention. The inverter 500 depicted in FIG. 5 comprises a stage of the current-starved ring oscillator 314. An odd number of inverters 500 are ganged together in a ring to create the current-starved ring oscillator 314.

Figure 6:
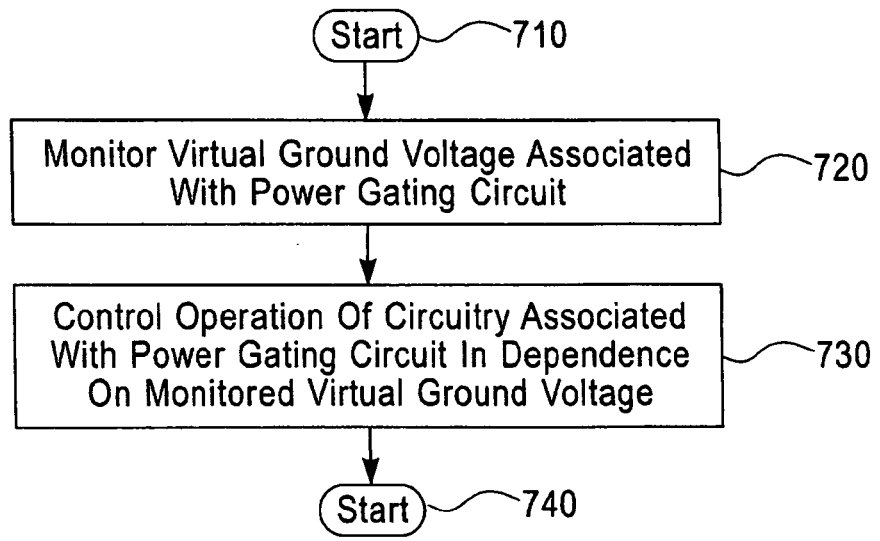
FIG. 6 is a flowchart depicting a method operating in accordance with the invention.

FIG. 6 is a flowchart depicting a method operating in accordance with an embodiment of the invention. The method starts at 610. Next, at 620, circuits configured in accordance with the invention monitor the virtual ground voltage associated with a power gating circuit. Then, at 630, control circuits control the power gating circuitry in dependence on the monitored virtual ground voltage.

In one variant of the method depicted in FIG. 6, controlling operations of the integrated circuit further comprises controlling a clock of the integrated circuit. In further variants of the invention, controlling the clock frequency of the integrated circuit comprises reducing a clock frequency of the integrated circuit. The clock frequency of the clock of the integrated circuit is slowed, for example, to reduce the impact of transients generated during switching of the power gating switch. The transients may be associated with ground bounce.

In another variant of the method depicted in FIG. 6 controlling operation of the integrated circuit in dependence on the monitored virtual ground voltage further comprises introducing additional dead cycles between a sleep mode and function operation of the logic circuitry.

In a further variant of the method depicted in FIG. 6, controlling operation of the integrated circuit in dependence on the monitored virtual ground voltage further comprises generating an exception flag in dependence on the monitored virtual ground voltage. The exception flag indicates that the logic circuit may be operating in a region where results may be suspect or given to error.

Figure 7:
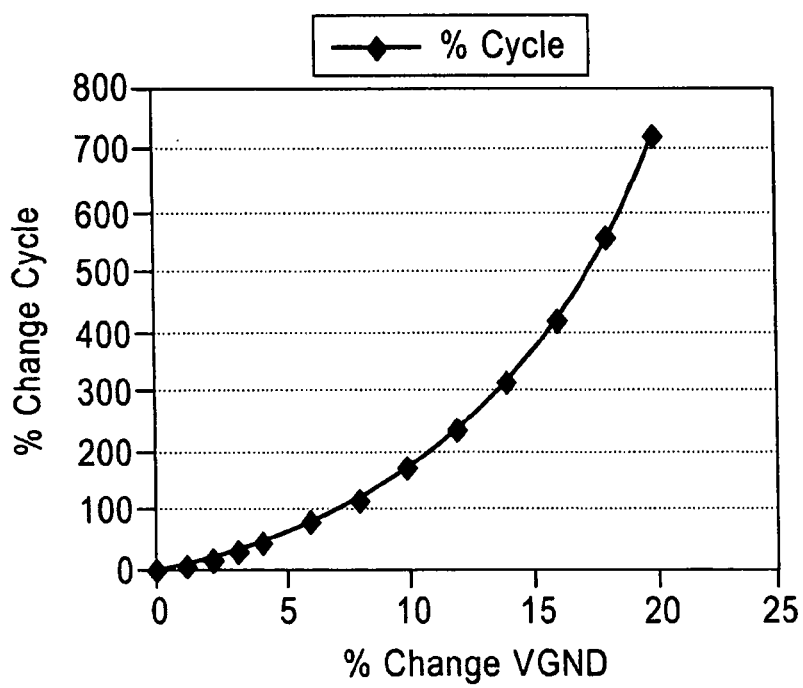
FIG. 7 is a chart depicting the percentage change in ring oscillator frequency as a function of the percentage change in virtual ground voltage in a circuit operating in accordance with the invention.

FIG. 7 is a chart depicting the percentage change in ring oscillator frequency as a function of percentage change in virtual ground voltage. As can be seen, small changes in virtual ground voltage result in a large change in ring oscillator frequency. This facilitates a particular advantage of the invention. Proper control of a logic circuit may depend on the ability to detect small changes in virtual ground voltage.

Those skilled in the art will appreciate that the invention can be applied to any method of power gating involving a switched supply rail, whether that is a virtual ground or a virtual power supply. Those skilled in the art also understand that the presentation of the current invention in terms of a virtual ground and footer does not preclude its application, via modifications straightforward to those skilled in the art, to power-gating via other supply rails (e.g., power-gating via a PFET-switched virtual supply).

Thus it is seen that the foregoing description has provided by way of exemplary and non-limiting examples a full and informative description of the best apparatus and methods presently contemplated by the inventors for monitoring power gating circuitry and for controlling circuit operations in dependence on monitored power gating conditions. One skilled in the art will appreciate that the various embodiments described herein can be practiced individually; in combination with one or more other embodiments described herein; or in combination with methods and apparatus differing from those described herein. Further, one skilled in the art will appreciate that the present invention can be practiced by other than the described embodiments; that these described embodiments are presented for the purposes of illustration and not of limitation; and that the present invention is therefore limited only by the claims which follow.

We claim:

1. An integrated circuit comprising:
    logic circuitry;
    a power gate switch coupled to at least a portion of the logic circuitry; and
    a virtual ground monitoring circuit configured to monitor voltage across the power gate switch;
    in which the virtual ground monitoring circuit comprises:
        an amplifier coupled to a virtual ground rail;
        a bias generator coupled to the amplifier;
        a ring oscillator coupled to the bias generator, a frequency of oscillation of the ring oscillator configured to change in dependence on changes in voltage across the virtual ground rail; and
        a counter coupled to the ring oscillator, the counter configured to count transitions in a signal output by the ring oscillator.

2. The integrated circuit of claim 1 wherein the virtual ground monitoring circuit further comprises an output configured to convey a signal indicating the voltage across the power gate switch, the circuit further comprising:
    a control circuit coupled to the output of the virtual ground monitoring circuit, the control circuit configured to control the integrated circuit in dependence on the signal indicating the voltage across the power gate switch.

3. An integrated circuit comprising:
    logic circuitry;
    a ground rail;
    a power gate switch coupled between the logic circuitry and the ground rail, a node between the logic circuitry and the power gate switch corresponding to a virtual ground rail, the power gate switch configured to switch power to the logic circuitry on and off;
    a virtual ground monitoring circuit configured to monitor voltage across the power gate switch, the virtual ground monitoring circuit comprising a signal output configured to output a virtual ground monitor signal that changes in dependence on changes to the voltage across the power gate switch;
    a clock; and
    a control circuit coupled to the signal output of the virtual around monitoring circuit, the control circuit configured to control the clock of the integrated circuit in dependence on the virtual ground monitor signal.

4. The integrated circuit of claim 3 wherein the virtual ground monitoring circuit further comprises:
    an amplifier coupled to the virtual ground rail;
    a bias generator coupled to the amplifier;
    a ring oscillator coupled to the bias generator, a frequency of oscillation of the ring oscillator configured to change in dependence on changes in voltage across the virtual ground rail; and
    a counter coupled to the ring oscillator, the counter configured to count transitions in a signal output by the ring oscillator.

5. The integrated circuit of claim 3, wherein the control circuit is further configured to reduce a clock frequency of the clock of the integrated circuit.

6. The integrated circuit of claim 5 wherein the control circuit is further configured to slow a clock frequency of the clock of the integrated circuit to reduce the impact of transients generated during switching of the power gate switch.

7. The integrated circuit of claim 6 wherein the transients are associated with ground bounce.

8. The integrated circuit of claim 3, wherein the control circuit is further configured to control the integrated circuit to introduce additional dead cycles between a sleep mode and functional operation of the logic circuitry in dependence on the virtual ground monitor signal.

9. The integrated circuit of claim 3, wherein the control circuit is further configured to generate an output signal in dependence on the virtual ground monitor signal.

10. A method comprising:
    monitoring a virtual ground voltage across a power gate switch in an integrated circuit comprising at least the power gate switch and logic circuitry; and
    controlling operation of the integrated circuit in dependence on the monitored virtual ground voltage at least by reducing a clock frequency of a clock of the integrated circuit.

11. The method of claim 10, wherein the clock frequency of the clock of the integrated circuit is slowed to reduce the impact of transients generated during switching of the power gate switch.

12. The method of claim 11 wherein the transients are associated with ground bounce.

13. The method of claim 10 wherein controlling operation of the integrated circuit in dependence on the monitored virtual ground voltage further comprises introducing additional dead cycles between a sleep mode and functional operation of the logic circuitry.

14. The method of claim 10 wherein controlling operation of the integrated circuit in dependence on the monitored virtual ground voltage further comprises generating an exception flag in dependence on the monitored virtual ground voltage;
   in which the exception flag indicates that results of the controlling operation of the integrated circuit is subject to error.

15. An integrated circuit comprising:

logic circuitry;

a power gate switch coupled to at least a portion of the logic circuitry;

a virtual ground monitoring circuit configured to monitor voltage across the power gate switch; and a control circuit configured to introduce dead cycles during switching operations of the logic circuitry in dependence on an output of the virtual ground monitoring circuit.

* * * * *